United States Patent [19]

Del

[11] 4,180,608
[45] Dec. 25, 1979

[54] PROCESS FOR MAKING MULTI-LAYER PRINTED CIRCUIT BOARDS, AND THE ARTICLE RESULTING THEREFROM

[76] Inventor: Joseph A. Del, 16326 Barneston St., Granada Hills, Calif. 91344

[21] Appl. No.: 922,758

[22] Filed: Jul. 7, 1978

Related U.S. Application Data

[63] Continuation of Ser. No. 757,753, Jan. 7, 1977, abandoned.

[51] Int. Cl.² .................... B32B 7/06; B32B 31/00
[52] U.S. Cl. .............................. 428/196; 29/625;
    156/235; 156/249; 156/312; 156/246; 156/309;
    156/330; 174/68.5; 428/415; 428/417; 428/901;
    428/416; 428/418; 428/40; 428/332
[58] Field of Search .............. 156/309, 247, 312, 249,
    156/231, 313, 235, 324, 238, 330, 246, 901, 902;
    264/272; 29/625; 174/68.5; 428/40, 901,
    415–418, 196

[56] References Cited

U.S. PATENT DOCUMENTS

| 2,559,649 | 7/1951 | Little et al. | 156/231 |
| 2,963,538 | 12/1960 | Dahlgren | 156/306 |
| 3,348,990 | 10/1967 | Zimmerman et al. | 29/625 |
| 3,509,270 | 4/1970 | Dube et al. | 29/625 |

OTHER PUBLICATIONS

Velten, "Epoxy", Modern Plastics Encyclopedia, vol. 51, No. 10 A, pp. 30 & 32, 10–1974.

Primary Examiner—John T. Goolkasian
Assistant Examiner—J. J. Gallagher
Attorney, Agent, or Firm—I. Morley Drucker

[57] ABSTRACT

A process is described for the manufacture of a void-free multi-layer printed circuit board (PCB). The process includes the steps of, first, laminating one or both sides of a PCB provided with circuitry details, to a cast thermosetting resin layer comprising essentially a B-staged, resin system solid at room temperatures but having a resin flow, under standard curing conditions, greater than a prepreg layer containing glass cloth impregnated by the B-staged resin system. The initial laminating step proceeds at temperatures and/or times substantially below curing conditions to form a prefilled PCB laminate wherein said cast thermosetting resin layer remains B-staged and which is very low in voids. Secondly, one or more of the prefilled PCB laminates are assembled between prepreg layers, each prepreg layer comprising glass cloth impregnated by a second B-staged thermosetting resin compatible with, or the same as, said B-staged thermosetting resin of said cast thermosetting resin layer. Finally, the prefilled PCB laminates and the prepreg layers are laminated (along with other PCB layers, perhaps) under curing conditions, to insure the formation of a void-free multi-layer PCB. The invention is also directed to the article of manufacture made by the process.

9 Claims, 6 Drawing Figures

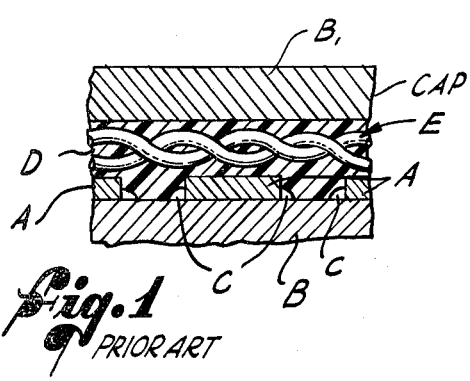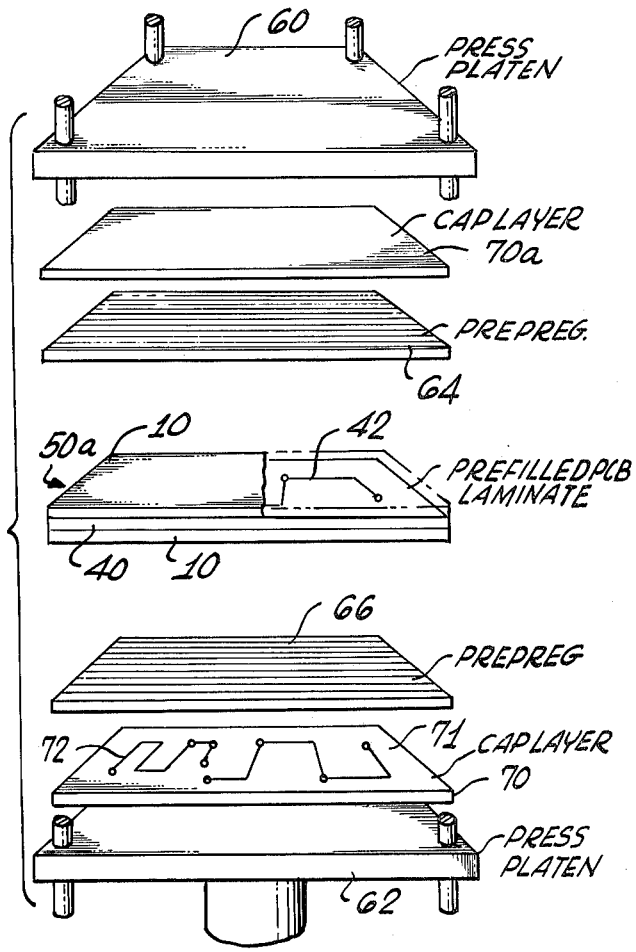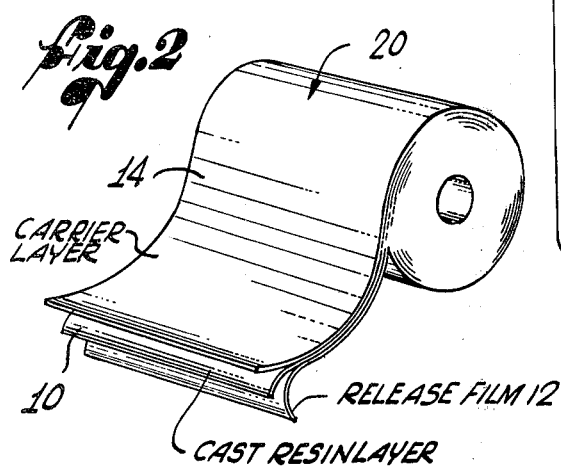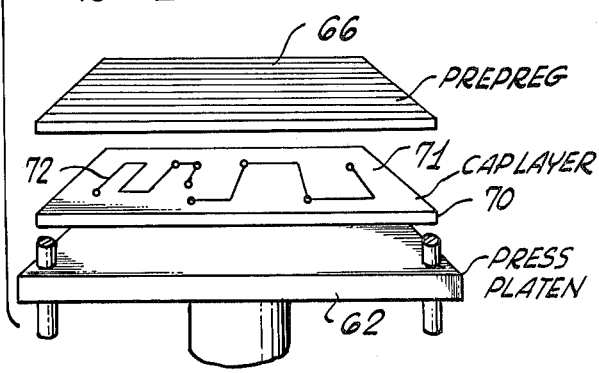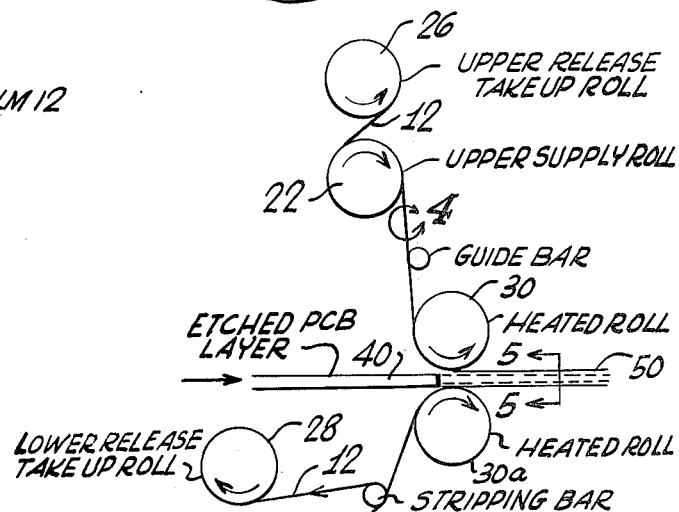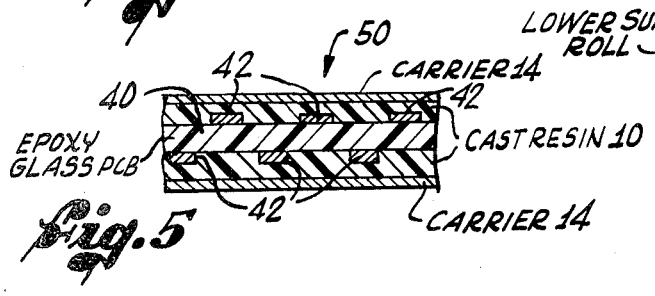

PROCESS FOR MAKING MULTI-LAYER PRINTED CIRCUIT BOARDS, AND THE ARTICLE RESULTING THEREFROM

This application is a continuation of Ser. No. 757,753, filed Jan. 7, 1977, now abandoned.

BACKGROUND OF THE INVENTION

In the art of encapsulating and bonding of printed circuit boards together to form multiple layers of printed circuit boards (hereinafter and in the claims sometimes termed multi-layer PCB'S) it is standard practice to bond the multiple layers of printed circuit boards by means of a partially cured glass-reinforced epoxy resin layer. Such a reinforced resin layer is termed a prepreg in the art and takes this name from the fact that a woven glass layer of a certain mesh size and thickness is pre-impregnated with a solution including primarily epoxy resin, catalysts and/or curing agents and other modifiers therefore, and then heated to only partially cure, i.e., B-stage, the particular epoxy resin system.

The resulting B-staged prepreg sheet material is a solid, at room temperature, has a predetermined resin thickness, a predetermined gel time, and predetermined resin flow under predetermined curing conditions of time, temperature and pressure upon final lamination of the multi-layer boards.

In order to control resin flow under curing conditions, standard prepreg sheets are made with varying ratios of resin (e.g., epoxy resin) to glass cloth, the maximum amount of epoxy resin being about 83% by weight, where maximum amount of resin fill of the copper circuitry is desired; the minimum amount of resin utilized is about 40% by weight, with the balance being essentially glass cloth, where a substantially different dielectric effect may be desired. Resin flow from the prepreg during the standard lamination and curing cycle (345° F. at 200 psi for 45 minutes) can thus be designed to vary from a low of about less than 2% to as high as about 50–54% depending upon the ratio of resin to glass cloth. Resin flow % is that percentage of weight loss of resin from the original prepreg layer, when subjected to standard test conditions, e.g., in accordance with MILG-55636A specifications. Such specifications include subjecting the prepreg material to a pressure of 200 psi, for 45 minutes at 340° F.

The amount of resin flow of the prepreg during the curing and lamination cycle is critical. Too little resin flow may not completely encapsulate dense copper layers of printed circuitry on the PCB. Too much resin flow will alter the thickness of the prepreg and the dielectric characteristics. The possibility of creating voids is particularly great where the metal circuit line or layer, e.g., of copper, is laid down on the circuit board in thick layers and/or is of high density (e.g., as is required for grounding circuits) making it extremely difficult for the resin of the prepreg material to flow completely into the deep corners formed between circuit board and the printed circuit details. Such a void condition is shown in FIG. 1 of the drawings.

Referring now to FIG. 1, a glass reinforced B-staged, epoxy resin system prepreg layer D of the prior art is there shown, in a laminated and cured state, placed between an epoxy-glass printed circuit board (PCB) layer $B_1$, and a second PCB designated B. The layer $B_1$ may be a so-called exterior, or cap, layer and may or may not carry circuitry details thereon. The PCB layer B carries, on one side thereof, a plurality of conductors A of relatively great thickness. In the circuit configuration shown in FIG. 1, voids C are formed between conductors A and the PCB layer B because the resin of the prepreg layer D cannot flow sufficiently into corners, to completely encapsulate the conductors A, even where a maximum resin flow type of prepreg is utilized, because of the presence of the glass cloth reinforcing layer E. The presence of voids can result in moisture penetration, circuit deterioration, and ultimately loss of circuit integrity.

In order to overcome the presence of voids during the manufacture of multi-layer circuitry, some manufacturers, prior to the lamination of alternating layers of multiple printed circuit boards and prepreg layers, have first flowed onto the PCB whose circuit is to be encapsulated, a pure or substantially pure liquid B-staged, resin system of a type that is compatible with the material of the circuit board. Such a resin, for example, may be a liquid epoxy resin system that has not been cured to any significant extent. Such a resin system is necessarily a viscous liquid, at room temperature, in order that the PCB may be readily adherently coated. The liquid resin-coated PCB is then placed between standard prepreg layers and laminated under temperature and pressure sufficient to cure the prepreg layers and the resin coating in the usual manner.

While voids may be eliminated from the circuitry of multi-layer PCB by the just-described method, the procedure is (1) difficult to work with, (2) time consuming, and, furthermore, (3) does not enable one to retain close control of dielectric separation, parallelism and thickness uniformity in the finished multi-layer PCB.

The major objective of this invention is to provide a simplified process for the bonding of i.e., laminating, multiple layers of PCB's by means of standard prepreg layers in which the possibility of voids adjacent the circuitry of the PCB layers is substantially eliminated, without significantly altering the dielectric properties, parallelism and thickness uniformity provided by the standard prepreg layers.

SUMMARY OF THE INVENTION

Printed circuit boards are first manufactured by conventional techniques such as by chemical milling or etching, and photo-resist techniques. The printed circuit boards are preferably made of fully cured epoxy-glass cores with the circuitry formed on one or both sides of the epoxy-glass cores.

In order to laminate these PCB's by means of any of the standard epoxy-glass prepreg materials readily available, and positively eliminate the voids problem set forth in the background section of this invention, the process and product of this invention requires, first, the making of a thin layer, or film of a slightly B-staged thermosetting resin system cast onto a release-coated carrier sheet. The thermosetting resin system employed is preferably made essentially of one or more epoxy resins, and catalysts and curing agents therefor as well as possibly other modifying materials. The epoxy resin system is formulated in a molten state, at elevated temperatures. However, due to the particular epoxy resins employed in the resin system, upon casting of the hot resin system onto the release-coated carrier sheet, and cooling thereof to room temperatures, the cast layer will solidify on cooling and remain solid, at room temperature. The solid cast resin layer is preferably formed with a uniform thickness of between about 3-6 mil.

The solid cast resin layer, and carrier sheet therefor, is then laminated to one or both sides of the PCB from which the voids are to be eliminated, as follows: the 3-6 mil cast resin layer is first laminated to the desired PCB side, or sides, at a temperature of between about 150° F.-250° F. (preferably at a temperature of between about 170° F.-200° F.) and at a minimal amount of pressure. Lamination takes place, well below curing conditions so as not to further advance the B-staging of the cast resin system to any significant extent. The lamination takes place, preferably, by feeding the PCB and cast resin layer between heated nip rollers, at a speed of 3-6 fpm for lamination.

The first lamination step enables the pure epoxy resin system of the cast layer to flow around, and completely encapsulate, the circuitry of the PCB resulting in a prefilled PCB laminate having a low void content.

In preparing the final multi-layer PCB, the PCB's with the cast resin layer laminated thereto, are finally laminated, under curing conditions of time, temperature and pressure, between layers of standard prepregs, in a conventional manner.

The unsupported cast resin of the prefilled PCB laminate has a resin flow % under standard test conditions greater than that of the prepreg layers. During the final lamination, some of the cast resin of the prefilled PCB laminate will be squeezed out of the laminate. The amount removed depends upon the circuit design, its density and thickness. However, because of the high degree of resin flow of the cast resin layer, under the curing conditions of the final lamination, the circuitry details on the PCB are completely encapsulated and a void-free laminate is now assured. The surrounding standard prepreg layers function as before, to provide close control of dielectric separation, parallelism and thickness uniformity.

The final laminated multi-layer PCB may be then punched, stack drilled and, or otherwise fabricated and through-hole plated, in a conventional manner.

While cast resin layers comprising a B-staged, thermosetting resin system are known for a variety of purposes, to the best of our knowledge, the use of such cast resin layers in combination with PCB's to first form a prefill-PCB laminate, followed by final lamination of one or more of such prefill-PCB laminates between standard prepregs (together with other PCB layers, perhaps) to form a final, essentially void-free, multi-layer PCB, having uniform, reproducible, dielectric properties, parallelism and thickness uniformity, is believed to be novel, and a substantial advance in the art of manufacture of multi-layer PCB's.

BRIEF DESCRIPTION OF THE DRAWINGS

FIG. 1 is a partial cross-sectional view, in elevation, of two plastic resin-glass printed circuit boards between which a standard prepreg layer has been laminated, in accordance with the teachings of the prior art;

FIG. 2 is a perspective view of a cast resin layer, used as a prefill laminating material, in this invention;

FIG. 3 is a schematic view, in side elevation, of a processing line for the lamination of the cast resin layer to a printed circuit board;

FIG. 4 is an enlarged, cross-sectional, fragmentary view of the cast resin layer, after removal of a protective release film, taken along the arcuate line 4—4;

FIG. 5 is an enlarged, cross-sectional fragmentary view of the prefilled PCB laminate, taken along the line 5—5, after emergence from the processing line of FIG. 3; and FIG. 6 is an exploded, perspective schematic view of the apparatus employed for the final lamination of PCB's standard prepreg layers, and prefilled PCB laminates to form the final, cured, multi-layer PCB of this invention.

DETAILED DESCRIPTION

The practice of this invention requires, initially, the formation of a cast, B-staged, thermosetting resin layer, which is solid at room temperatures. The resin utilized is essentially a resin of a type that is compatible with the resin of the cured resin-glass cores of the PCB's and the resin of the B-staged resin-glass of the prepeg layer. It is to be understood that the term "compatible" as used herein, and in the claims, includes the cases where the same chemical type or class of resins is used as the resin in the cast resin layer, the PCB cores, and the prepreg layers. Generally speaking, the multi-layer PCB technology today employs, in the main, epoxy resins in combination with woven glass cloth for both the cured cores of the PCB's and for the formation of conventional B-staged prepreg layers.

Epoxy resins are mainly utilized because of the relative ease with which they can encapsulate and pot electrical components. The epoxy systems exhibit high dielectric strength, good moisture resistance, good chemical resistance, and good resistance to both the mechanical and electrical shocks.

Epoxy resins may be divided broadly into two categories: (1) glycidyl ether resins and epoxidized resins. Examples of the first category are the well known bisphenol A-epichlorohydrin resins, and the epoxy novolac resins. Examples of the second category are a cycloaliphatic epoxy resin-carboxylate type, bis (2,3-epoxycyclopentyl) ether and vinylcyclohexene dioxide. Idealized structures of some of the epoxy resins are set forth in Modern Plastics, Encyclopedia, 1967, Volume 44, No. 1A (McGraw-Hill, Inc., New York, New York) incorporated herein by reference. As is well known, epoxy resin systems incorporate catalysts and/or curing agents to effect cross-linking of the resin, and may incorporate also diluents, fillers, etc. depending upon the mechanical and electrical and other properties desired in the final resin-glass PCB composite. These materials and systems are also discussed in Modern Plastics Encyclopedia, 1967 supra and are well known to those skilled in the art. The term "epoxy resin system" as used herein, and in the claims, will refer to those systems which incorporate, in addition to the basic epoxy resin material, catalysts and/or curing agents therefor, other modifying materials such as fillers, diluents and the like.

In order to prepare the cast resin layer employed in this invention, the thermosetting resin to be employed, (e.g., an epoxy resin) is first melted, preferably at its minimal M.P.*, in a suitable container. The molten epoxy resin is then intermixed with preferably an anhydride or amine type of curing agent which has been previously dissolved in a suitable solvent such as acetone.

*M.P. = melting point

The solvent is then driven off, under vacuum, resulting in an exceedingly small solvent content in the epoxy resin system.

The resulting epoxy resin system is again heated to the minimum M.P. then spread onto a carrier sheet to a thickness of between about 3-6 mils. The carrier sheet, preferably is made of a release-coated paper. The epoxy resin layer is then cooled, to a solid state, at room temperature and a release film, made of conventional materials, is placed onto the solid, cast epoxy resin layer to form a sandwich type of cast resin layer structure. The cast epoxy resin sandwich structure is preferably produced in roll form-so that multi-layer PCB structures of a great variety of sizes may be prefilled and laminated by the process of this invention.

The resulting cast resin sandwich layer is best shown in FIG. 2, and is designated generally by the numeral 20. The carrier paper bears the number 14, the release film is designated by the numeral 12 and the cast resin layer by the numeral 10. For convenience of description and by way of example only, the layers 10, 20 will be sometimes referred to, herein, as incorporating epoxy-resin materials.

It is to be noted that the cast resin (e.g. of the epoxy resin system type) employed as the prefill resin for the PCB has been only slightly B-staged to this point and will therefore readily flow into the etched cavities of the PCB under the final laminating and curing conditions of time, temperature and pressure.

The cast epoxy resin system of the layer 10 is formulated from resins that, when intermixed and compounded, will remain solid, at room temperatures. When laminated to PCB's to form a prefilled laminate structure, the cast resin layer 10 will be subjected to some resin flow and when subjected to the curing conditions of the later, final, lamination step will be subjected to further resin flow to insure, thereby, a void-free multi-layer PCB. For purposes of this invention, the degree or extent of resin flow of the B-staged, cast resin layer 10 is greater than the resin flow of a prepreg layer having the same B-staged resin system impregnated with glass cloth when tested under standard test conditions such as those previously set forth herein.

Rolls of the solid, cast epoxy resin sandwich material 20 are then placed onto upper and lower supply rolls 22, 24, respectively, of the prefill laminating process line of FIG. 3. The release layers 12 are peeled back and threaded onto upper and lower release take up rolls 26, 28, respectively. Each of the cast epoxy resin layers 10, together with its associated carrier layer 14, is then fed from each supply roll 22, 24, to and between heated pressure, or nip, rollers 30, 30a, along with an epoxy-glass PCB 40 having etched circuit details on both sides thereof as shown in FIG. 3. Each of the cast, epoxy resin layers 10 are laminated to the surfaces of the PCB 40 under the heat and pressure applied by nip rollers 30, 30a. The preferred temperature of lamination for the epoxy resin layers 10 ranges between about 150° F.-250° F. with a presently preferred temperature of about 170° F.-200° F. The pressure applied is the minimal pressure required for lamination. Lamination proceeds preferably at the rate of 3-6 fpm. The resin system in the resulting prefilled laminate structure 50 is only slightly further B-staged under these laminating conditions.

A cross-section through the resulting prefilled PCB laminate structure 50 is shown in FIG. 5. The B-staged cast resin layers 10 are laminated to the PCB 40 immediately adjacent the copper circuitry details 42. The carrier paper 14 remains on the prefill PCB laminate composite 50 until just prior to final assembly of the laminate 50 with prepreg layers 64, 66. (See FIG. 6). It is to be noted that the cast resin film 10 is supported either by the carrier layer 14 (prior to pre-lamination to the PCB layer 40) or is supported by the PCB 40 after pre-lamination to the PCB and removal of the carrier layer 14.

The prefill PCB laminate composite, without the carrier layer 14, is designated by the numeral 50a. One or more of such composites 50a are then placed between conventional press platens 60, 62 along with upper and lower standard prepreg sheets 64, 66 of predetermined thickness, resin content, resin flow, and dielectric characteristics. The prepreg sheets 64, 66 preferably constitute an epoxy resin-glass cloth system in which the epoxy resin content varys from about 40-80%, by weight, with the balance being substantially glass cloth. The epoxy resin system of the prepreg is in a B-staged condition, and has a gel time, at about 340° F. of between about 85 to 275 sec. preferably.

Prepreg layers of the type described are well known in the art, and are made by a number of different manufacturers. The resin flow % of the prepreg layers vary between less than about 2% to as high as 54%, under standard test conditions prevously described herein.

The cap layers, or exterior PCB layers, 70, 70a, are usually provided with circuitry details 72 on the inner faces 71 thereof, respectively. The circuitry details 72 are usually quite thinly laid down onto the inner surfaces 71, and standard prepreg sheets 64, 66 of the type just described may be laminated to an unfilled PCB, i.e., without the necessity of employing a prefill PCB laminate for the cap PCB layers 70, 70a-before final lamination thereof. If the circuitry details are sufficiently thick or dense, a prefilled PCB laminate for the cap layers 70, 70a may be required to insure a void-free lamination of cap layer to prepreg.

The prefill PCB laminate 50a is thus assembled for lamination between layers 64, 66 and cap layers 70, 70a are placed above and below prepreg layers 64, 66, as shown in FIG. 6. The press platens 60, 62 are then heated to curing temperature, which in the case of the epoxy resin system lies at about 340°-350° F. for a period of about 45 minutes. Pressure applied during cure preferably varies from about 200 psi to about 350 psi.

The inner etched PCB layer 40 of the resulting multi-layer PCB laminate 80 are essentially void-free because of the increased resin flow of the cast resin layers 10, immediately adjacent both sides of the PCB 40, during lamination, under curing conditions. At the same time, the thickness uniformity, the dielectric properties, and parallelism of the PCB's in the multi-layer are closely controlled by means of the prepreg layers 64, 66 immediately adjacent the resin-rich cast layers 10.

A specific operating example will now be set forth:

An epoxy resin system for use as the cast resin layer of this invention is made as follows:

50 parts, by weight, of Shell 828 liquid (manufactured by Shell Chemical Company) epoxy resin is ball-milled with 4 parts, by weight, of a dicyandiamide hardener, dissolved in acetone, to effect a uniform dispersion of the hardener with the epoxy resin. 50 parts of Dow 542 epoxy resin (manufactured by Dow Chemical Company) (containing 44-48% bromide by weight), solid at room temperature, is heated to its M.P. and the liquid dispersion of hardener and Shell 828 resin is added thereto to form a hot admixture. 2 parts, by weight, of benzyl dimethyl amine (BDMA) accelerator is also added to the hot admixture. The acetone solvent is then removed by vacuum.

The hot admixture is then spread onto a conventional release-coated carrier paper to achieve a predetermined thickness of between 3–6 mil. The hot admixture is then allowed to cool, and solidifies to form the cast resin layer (10). A release or separator sheet (12), made of a polyethylene film, preferably of about 2 ml. thickness is applied to the exposed side of the cast layer 10 for protective purposes.

The resulting cast resin layer 10, sandwiched between carrier sheet 14 and release film 12 is presently preferably, manufactured in rolls of perhaps 250', or more, in length and widths of between 1'–3'.

The release film 12 is later removed, and the cast resin layer and carrier therefor of the type just described, is then laminated to a PCB, carrying copper circuitry details, following the process shown in FIG. 3 to form the prefilled PCB laminate (50). The PCB employed has an epoxy-glass core of a conventional type (e.g., Fortin Laminating Corporation copper clad epoxy-glass laminate B33) that is compatible with the epoxy resin system of the cast resin layer. The lamination temperature is 180° F. and the throughput of prefilled PCB is 4 fpm.

One or more prefilled PCB laminates are then assembled between conventional prepreg sheets made of epoxy resin and glass cloth, and cap layers of epoxy-glass cap layers of conventional design are added. The assembly is laminated, under standard curing conditions of 340°±5° F. 200 psi±2, for 45 minutes, in a standard hot or cold press. The prepreg sheets employed are any one of series of Fortin Laminating Corporations prepreg systems-e.g., A13-112-60-181, meeting MIL-Spec. PC-GE. This prepreg system is provided with a 0.0032" glass cloth thickness, an overall prepreg thickness of 0.0055", an average pressed thickness at 200 psi of 0.0042", a resin content of 60±3%, a resin flow of 32±7% and a gel time of 110±20 sec. The epoxy resin system in the prepreg employed to achieve these particular properties, may be anyone of a number of epoxy resins, catalysts and curing agents well known to and available, to those skilled in the art such as the Shell 828 and Dow 542 epoxy resins, dicyandiamide hardener and BDMA accelerator previously mentioned.

The prefilled PCB laminate 50, forming part of this invention, is conveniently formed in conventional dry film laminating apparatus used extensively in the manufacture of etched circuit details by photo-resist techniques. Hence, the manufacturer of etched PCB's may well already have conventional equipment at his disposal with which to fabricate the improved multi-layer PCB laminate herein described.

Various modifications of the multi-layer PCB laminate, the materials utilized, and process steps will be apparent to those skilled in the art. Hence, I intend to be bound only by the claims which follow.

I claim:

1. A process for making a multi-layer printed circuit board (PCB) which includes, in sequence, the steps of:
   first laminating at least one side of a PCB provided with circuitry details, to a cast thermosetting resin layer, of about 3–6 mil thickness, carried on a release-coated carrier sheet, said cast thermosetting resin layer comprising essentially a first, B-staged, epoxy resin system solid at room temperatures, said first laminating step proceeding at temperatures and/or times substantially below curing conditions of said cast thermosetting resin layer to form a prefilled PCB laminate including said release-coated carrier sheet wherein said cast thermosetting resin layer remains B-staged;
   second, removing said release-coated carrier sheet;
   third, assemblying at least one of said prefilled PCB laminates with prepreg layers, each prepreg layer comprising glass cloth impregnated by a second B-staged epoxy resin system compatible with said first B-staged epoxy resin system of said cast thermosetting resin layer, said prepreg layer having a resin flow, under standard conditions, that is less than the resin flow of said cast thermosetting resin layer; and
   fourth, laminating each of said prefilled PCB laminates and said prepreg layers, under curing conditions, to cure the B-staged thermosetting resins in said prefilled PCB laminates and prepreg layers and form a fully cured essentially void-free multi-layer PCB.

2. The process of claim 1 wherein said multi-layer PCB includes the assemblying of additional printed circuit boards as exterior layers relative to said prepreg layers, prior to the laminating of the multi-layer assembly, under curing conditions.

3. The process of claim 1 wherein said first laminating step proceeds at temperatures between about 150° F. to 250° F.

4. The process of claim 1 wherein the laminating of each of said prefilled PCB laminates and said prepreg layers takes place under curing conditions which include temperatures of about 340°–350° F., at pressures of at least about 200 psi and for a period of time of at least about 45 minutes.

5. In the process for making a multi-layer printed circuit board (PCB) the improvement which comprises the steps of:
   laminating at least one side of a PCB, which is provided with circuitry details, to a cast thermosetting resin layer, of about 3–6 mil thickness, carried on a release-coated carrier sheet, said thermosetting resin layer comprising essentially a B-staged, epoxy resin system having a resin flow, under curing conditions, greater than a prepreg layer containing glass cloth impregnated by said B-staged resin, said laminating step proceeding at temperatures and/or times substantially below curing conditions to form a prefilled PCB laminate including said release-coated carrier sheet wherein the cast resin layer remains B-staged, and prior to the lamination of multiple PCB layers; and removing said release-coated carrier sheet.

6. The process of claim 5 wherein said laminating step proceeds at temperatures between about 150° F. to 250° F.

7. The product formed by the process of claim 1.
8. The product formed by the process of claim 2.
9. The product formed by the process of claim 5.